United States Patent
Yoshimi (10) Patent No.: US 10,290,792 B2
(45) Date of Patent: May 14, 2019

(54) THERMOELECTRIC ELEMENT AND THERMOELECTRIC MODULE COMPRISING THREADED SCREWS, AND MANUFACTURING METHOD THEREOF

(71) Applicant: AISIN TAKAOKA CO., LTD., Toyota-shi, Aichi (JP)

(72) Inventor: Hitoshi Yoshimi, Toyota (JP)

(73) Assignee: AISIN TAKAOKA CO., LTD., Toyota-Shi, Aichi (JP)

( * ) Notice: Subject to any disclaimer, the term of this patent is extended or adjusted under 35 U.S.C. 154(b) by 0 days.

(21) Appl. No.: 15/033,429

(22) PCT Filed: Oct. 28, 2014

(86) PCT No.: PCT/IB2014/065648
§ 371 (c)(1),
(2) Date: Apr. 29, 2016

(87) PCT Pub. No.: WO2015/063673
PCT Pub. Date: May 7, 2015

(65) Prior Publication Data
US 2016/0254432 A1 Sep. 1, 2016

(30) Foreign Application Priority Data
Oct. 30, 2013 (JP) .................................. 2013-224989

(51) Int. Cl.
*H01L 35/06* (2006.01)
*H01L 35/32* (2006.01)
*B22C 7/02* (2006.01)
*B22C 9/04* (2006.01)
*H01L 35/10* (2006.01)
(Continued)

(52) U.S. Cl.
CPC ................ *H01L 35/06* (2013.01); *B22C 7/02* (2013.01); *B22C 9/04* (2013.01); *H01L 35/10* (2013.01); *H01L 35/32* (2013.01); *H01L 35/34* (2013.01); *H01L 23/4006* (2013.01)

(58) Field of Classification Search
CPC ...... H01L 23/4006; H01L 35/06; H01L 35/32
See application file for complete search history.

(56) References Cited

U.S. PATENT DOCUMENTS 7,982,278 B2 7/2011 Tokunaga et al.
2005/0175952 A1* 8/2005 Toba ................ H01L 21/67109
432/241

(Continued)

FOREIGN PATENT DOCUMENTS

CN 103460421 A 12/2013
JP 03-297617 A 12/1991

(Continued)

OTHER PUBLICATIONS

English machine translation of JP 2007-073889 A of record.*

(Continued)

*Primary Examiner* — Yu Chen
*Assistant Examiner* — Christopher M Roland
(74) *Attorney, Agent, or Firm* — Buchanan Ingersoll & Rooney PC (57) ABSTRACT

A thermoelectric element is formed with a thread portion on at least one end in an electromotive force generating direction.

6 Claims, 4 Drawing Sheets

(51) Int. Cl.
*H01L 35/34* (2006.01)
*H01L 23/40* (2006.01)

(56) References Cited

U.S. PATENT DOCUMENTS

| | | | |
|---|---|---|---|
| 2008/0164016 A1* | 7/2008 | Lee | F25B 39/04 |
| | | | 165/178 |
| 2008/0236644 A1* | 10/2008 | Sakurada | C22C 30/00 |
| | | | 136/239 |
| 2009/0189239 A1 | 7/2009 | Tokunaga et al. | |
| 2009/0316365 A1* | 12/2009 | Lin | H01L 23/427 |
| | | | 361/711 |
| 2012/0313498 A1* | 12/2012 | Hsu | F21V 29/004 |
| | | | 313/46 |

FOREIGN PATENT DOCUMENTS

| JP | 10-65222 A | | 3/1998 |
|---|---|---|---|
| JP | 11220184 A | * | 8/1999 |
| JP | 2005-317629 A | | 11/2005 |
| JP | 2007-073889 A | | 3/2007 |
| JP | 2009-206497 A | | 9/2009 |
| JP | 2009267316 A | | 11/2009 |
| JP | 2017152694 A | * | 8/2017 |
| WO | WO 2010066119 A1 | * | 6/2010 ............... F21K 9/00 |

OTHER PUBLICATIONS

English machine translation of JP H10-065222 A of record.*
Yamashita, O. et al. "Thermoelectric Properties of p- and n-type FeSi2 Prepared by Spray Drying, Compaction and Sintering Technique." Journal of Materials Science 38 (2003), pp. 1623-1629.*
International Search Report (PCT/ISA/210) dated Jan. 29, 2015, by the European Patent Office as the International Searching Authority for International Application No. PCT/IB2014/065648.
Written Opinion (PCT/ISA/237) dated Jan. 29, 2015, by the European Patent Office as the International Searching Authority for International Application No. PCT/IB2014/065648.
International Preliminary Report on Patentability (PCT/IPEA/409) dated Oct. 8, 2015, by the European Patent Office as the International Preliminary Examining Authority for International Application No. PCT/IB2014/065648.
Notice of Rejection dated Aug. 26, 2015, by the Japanese Patent Office in Application No. 2013-224989.
State Intellectual Property Office of People's Republic of China Notification of the First Office Action in Application No. 201480059852.6 dated Sep. 4, 2014.

* cited by examiner

THERMOELECTRIC ELEMENT AND THERMOELECTRIC MODULE COMPRISING THREADED SCREWS, AND MANUFACTURING METHOD THEREOF

CROSS-REFERENCE TO RELATED APPLICATIONS

The present application claims priority based on JP Patent Application No. 2013-224989 filed in Japan on Oct. 30, 2013, whose entire disclosure is incorporated herein by reference thereto.

FIELD

The present disclosure relates to a thermoelectric element, a thermoelectric module having the same, and a manufacturing method of a thermoelectric module.

BACKGROUND

As a thermoelectric module (also called a thermoelectric conversion module) using so-called the Seebeck effect or Peltier effect, the following which is disclosed in Patent Document 1 (Patent Literature 1: PTL 1) has been known. In this kind of thermoelectric module, P type and N type thermoelectric elements (also called thermoelectric conversion elements), being arranged by turns, are arranged between a pair of substrates in (on) which predetermined electrode patterns are formed.

PTL 1

JP2009-206497A

SUMMARY

The following analysis is given by the present invention.

In this kind of conventional above-mentioned thermoelectric module, it is necessary to arrange (perform positioning) a plurality (large number) of thermoelectric elements in predetermined positions onto the electrode patterns on the substrates. Successively, the thermoelectric elements and the electrode patterns are connected usually by soldering etc. Therefore, in manufacturing this kind of conventional above-mentioned thermoelectric module, it is necessary to perform accurately positioning of the thermoelectric elements relative to the electrode patterns, and connecting of the thermoelectric elements with electrode patterns, while maintaining such positioning state. Thereby, a manufacturing process of the thermoelectric module is very complicated.

The present invention is made in view of the situation etc. illustrated above. That is, it is an object for the present invention to save labor and time for positioning and connecting between a thermoelectric element(s) and an electrode(s) in manufacturing a thermoelectric module therefrom.

In a first aspect, there is provided a thermoelectric element, comprising:

a thread part formed on at least one end (side) of the thermoelectric element in an electromotive force generating direction.

In a preferred thermoelectric element, the thermoelectric element has a screw thread profile.

In the preferred thermoelectric element, the thermoelectric element is formed by precision casting using an evaporative pattern.

In a second aspect, there is provided a thermoelectric module, comprising:

a first thermoelectric element(s) having one thermoelectric property of P or N type, and having a thread portion formed on at least one end thereof in an electromotive force generating direction, a second thermoelectric element(s) having another thermoelectric property of P or N type, and having a thread portion formed on at least one end thereof in an electromotive force generating direction, and a connection electrode member(s) being provided to which the one ends of the first and second thermoelectric elements are fastened, using the threads thereof, for electrically connecting therebetween.

In a preferred thermoelectric module, the first and second thermoelectric elements have screw thread profiles, and the one ends of the first and second thermoelectric elements are screwed with the connection electrode member(s), thereby electrically connecting therebetween.

In a third aspect, there is provided a thermoelectric module, comprising:

a first thermoelectric element(s) having one thermoelectric property of P or N type, and having a screw thread profile, a second thermoelectric element(s) having another thermoelectric property of P or N type, and having a screw thread profile, a third thermoelectric element(s) having the one thermoelectric property of P or N type, and having a screw thread profile, a fourth thermoelectric element(s) having the another thermoelectric property of P or N type, and having a screw thread profile, a first connection electrode member(s) with which apical portions of the first and second thermoelectric elements are screwed, respectively, for electrically connecting therebetween, a second connection electrode member(s) with which apical portions of the third and fourth thermoelectric elements are screwed, respectively, for electrically connecting therebetween, and a third connection electrode member(s) provided to bridge between base end portions of the second and third thermoelectric elements for electrically connecting therebetween.

In a preferred thermoelectric module, the third connection electrode member(s) is provided with penetration holes through which the thread portions of the second and third thermoelectric elements pass without fitting (i.e., with tolerance or without secure engagement), and the base end portions of the second and third thermoelectric elements are fastened to the third connection electrode member(s) with nuts which are screwed with the thread portions of the second and third thermoelectric elements, respectively.

In a preferred thermoelectric element (or module), the thermoelectric element is formed with the thread portion on another end of the thermoelectric element in the electromotive force generating direction.

In a preferred thermoelectric element (or module), the thermoelectric element is formed with a head on another end.

In a fourth aspect, there is provided a thermoelectric module, comprising:

P-type thermoelectric elements having thread portions on both ends,

N-type thermoelectric elements having thread portions on both ends, and connection electrode members to which the P-type thermoelectric elements and the N-type thermoelectric elements are fastened, using the threads thereof, for electrically connecting therebetween.

In a fifth aspect, there is provided a manufacturing method of a thermoelectric module, comprising:

screwing a one end portion of a first thermoelectric element with a connection electrode member.

A preferred method further comprises fixing a head of the first thermoelectric element on another connection electrode member by tightening a nut on another end portion of the first thermoelectric element to sandwich the another connection electrode member between the head of the first thermoelectric element and the nut.

A preferred method further comprises electrically connecting a second thermoelectric element having different thermoelectric property from the first thermoelectric element to the first thermoelectric element via the connection electrode member by screwing a one end portion of the second thermoelectric element with the connection electrode member.

Advantageous effects of the present disclosure are mentioned below without limitation. In the first aspect, the thermoelectric element has the thread portion in the one end in the electromotive force generating direction. Therefore, it is possible to form a connection, i.e., electrical connection between the thermoelectric element and an electrode member, by fixing the thermoelectric element and the electrode member (for example, the electrode member is made of a substrate having electrode patterns, or made of a metal plate, etc.) with such thread portion. Moreover, it is very easy to perform positioning between the thermoelectric element and the electrode member by providing in advance a thread hole, or a penetration hole, etc. corresponding to the thread portion of the thermoelectric element at a predetermined position in the electrode member, for example.

In the preferred mode, the thermoelectric element has a screw thread profile. For example, the thermoelectric element is screwed (thread-engaged) with a connection electrode member made of metal plate etc., so that the thermoelectric element and the connection electrode member are electrically connected each other. Moreover, it is very easy to perform positioning between the thermoelectric element and the electrode member or the adjacent thermoelectric elements by providing in advance a thread hole(s) or a penetration hole(s), etc. at a predetermined position(s) in the connection electrode member, for example. Furthermore, since the screw thread of the thread portion functions as a radiating fin, it is promoted to generate a temperature difference between the both ends of the thermoelectric element. Accordingly, an excellent thermoelectric conversion capability is acquired.

In the preferred mode, the thermoelectric element is formed by precision casting using the evaporative pattern. As a precision casting using the evaporative pattern, it is possible to use so-called lost-wax process, for example. Therefore, the thermoelectric element having the above profile is provided with excellent mass productivity.

In the second aspect, due to the thread portions which are formed on the one ends of the first and second thermoelectric elements in the electromotive force generating direction, respectively, the connection electrode member(s) are fixed to the first and second thermoelectric elements (the second thermoelectric element(s) has a different thermoelectric property from the first thermoelectric element(s)). Accordingly, a connection, i.e., electrical connection between the first and second thermoelectric elements; and the connection electrode member(s) is achieved. Moreover, the abovementioned one end of the first thermoelectric element(s) and the second thermoelectric element(s) are electrically connected each other through the connection electrode member. Furthermore, it is very easy to perform positioning between the first and second thermoelectric elements and the connection electrode member, and positioning of the adjoining first and second thermoelectric elements by providing in advance thread holes, or penetration holes, etc. at predetermined positions in the connection electrode member, for example. Therefore, the thermoelectric module equipped with a plurality of thermoelectric elements can be realized by a simple manufacturing process.

In the preferred mode, the one end of the first thermoelectric element formed in the screw thread profile is screwed with the connection electrode member. Moreover, the one end of the second thermoelectric element (which has the different thermoelectric property from the first thermoelectric element) formed in the screw thread profile is screwed with the connection electrode member. Accordingly, a connection, i.e., electrical connection between the first and second thermoelectric elements; and the connection electrode member is formed. Moreover, the one end of the first thermoelectric element and the one end of the second thermoelectric element are electrically connected through the connection electrode member. Therefore, according to this disclosure, the thermoelectric module equipped with a plurality of thermoelectric elements can be realized by a simple manufacturing process.

In the third aspect, the apical portion (one end) of the first thermoelectric element formed in the screw-like outside form is screwed with the first connection electrode member. Moreover, the apical portion (one end) in the second thermoelectric element (which has a different thermoelectric property from the first thermoelectric element) formed in the screw thread profile is screwed with the first connection electrode member. Accordingly, a connection, i.e., electrical connection between the first and second thermoelectric elements; and the first connection electrode member is formed. Moreover, the apical portion (one end) of the first thermoelectric element and the apical portion (one end) of the second thermoelectric element are electrically connected through the first connection electrode member.

Similarly, the apical portion (one end) of the third thermoelectric element (which has the same thermoelectric property as the first thermoelectric element, but a different thermoelectric property from the second thermoelectric element) having the thread profile is screwed with the second connection electrode member. Moreover, the apical portion (one end) of the fourth thermoelectric element is screwed with the second connection electrode member. The fourth thermoelectric element has the same thermoelectric property as the second thermoelectric element, but has a different thermoelectric property from the first and third thermoelectric elements. The fourth thermoelectric element is formed in the screw thread profile. Accordingly, a connection, i.e., electrical connection between third and fourth thermoelectric elements; and the second connection electrode member is formed. Moreover, the apical portion (one end) of the third thermoelectric element and the apical portion (one end) of the fourth thermoelectric element are electrically connected through the second connection electrode member.

Further, the third connection electrode member is provided so as to bridge between the base (another) end portion of the second thermoelectric element and the base (another) end portion of the third thermoelectric element. Accordingly, the base end portion of the second thermoelectric element and the base end portion of the third thermoelectric element are electrically connected via the third connection electrode member. Then, the first, second, third and fourth thermoelectric elements are connected each other in a state of arranging thermally in parallel and electrically in series.

It is very easy to perform positioning between the first and second thermoelectric elements; and the first connection electrode member, and positioning of the adjoining first and second thermoelectric elements by providing in advance screw holes, or penetration holes, etc. at predetermined positions in the first connection electrode member. The same is applied to the third thermoelectric element, the fourth thermoelectric element and the second connection electrode member. Therefore, according to this aspect, the thermoelectric module equipped with so-called "PI type" structure can be realized by a simple manufacturing process.

In the preferred mode based on the second aspect, the thread portions of the second thermoelectric element(s) and the third thermoelectric element(s) pass through the penetration holes of the third connection electrode member(s). Then, the second thermoelectric element and the third thermoelectric element are fastened to the third connection electrode member on base end portion (another side) of those elements, with the nuts which are screwed with the thread portions of the second thermoelectric element and the third thermoelectric element. Accordingly, a connection, i.e., electrical connection between the second and third thermoelectric elements; and the third connection electrode member is formed. Simultaneously, the base end portion of the second thermoelectric element and the base end portion of the third thermoelectric element are electrically connected via the third connection electrode member. In this way, the first, second, third and fourth thermoelectric element, are connected each other in a state of arranging thermally in parallel and electrically in series.

Due to the above penetration holes provided in advance at predetermined positions in the third connection electrode member, it is very easy to perform positioning between second and third thermoelectric elements and the third connection electrode member, and positioning between the adjoining elements, i.e., the second and third thermoelectric elements. Therefore, the thermoelectric module equipped with so-called "PI type" structure can be realized by a simple manufacturing process.

As explained in the above, according to the present disclosure, it is possible to save labor and time for positioning and connecting between a thermoelectric element(s) and an electrode(s).

PREFERRED MODES

Hereinafter, one exemplary embodiment of the present disclosure is explained, referring to drawings. In addition, modifications and/or variations are indicated at the end of Description, since the understanding of the explanation of the coherent one exemplary embodiment would be disturbed when such modifications and/or variations be inserted in the explanation of the exemplary embodiment.

<Structure of Thermoelectric Element and Thermoelectric Module>

Figure 1:
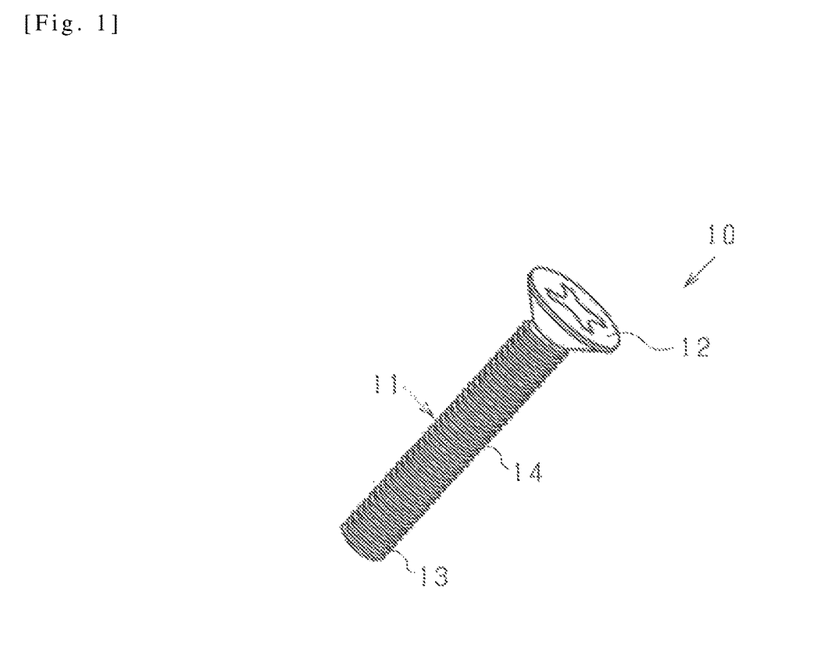
FIG. 1 is a perspective view illustrating an appearance of a thermoelectric element according to one exemplary embodiment.
Figure 2:
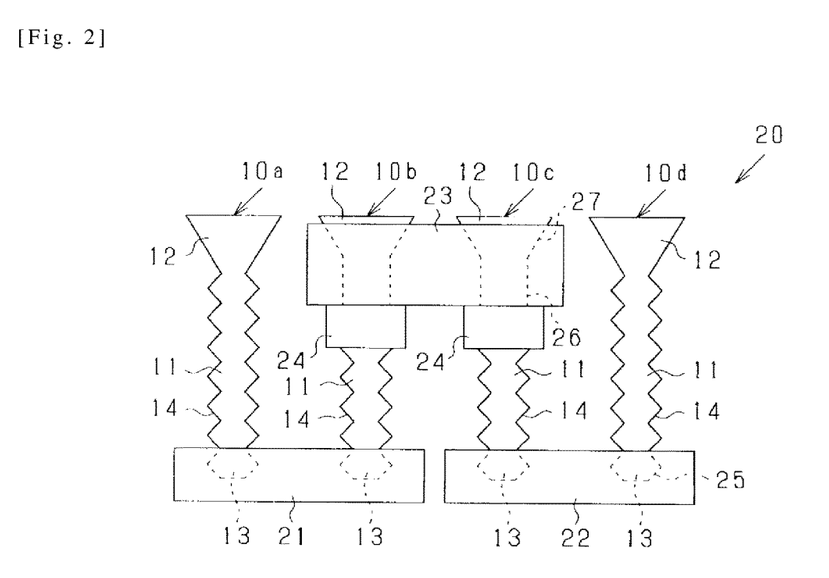
FIG. 2 is a side view illustrating an appearance of a thermoelectric module according to one exemplary embodiment, equipped with the thermoelectric element illustrated in FIG. 1.

As illustrated in FIG. 1, a thermoelectric element 10 according to one exemplary embodiment has a screw thread profile (the same applies to thermoelectric elements 10a, 10b, 10c, and 10d illustrated in FIG. 2, too.). Specifically, this thermoelectric element 10 is provided with a round bar-like shank 11 having a thread profile and a head 12 integratedly formed with the shank 11. The head 12 is formed on another end (base end) which is opposite to an apical portion 13. The head 12 is formed in a shape of a reverse truncated cone. That is, the thermoelectric element 10 is formed so-called in the shape of a flat head screw thread.

The thermoelectric element 10 is used such that an axial direction (which is parallel to the central axis of the shank 11) is an electromotive force generating direction. Specifically, this thermoelectric element 10 is constituted to generate electromotive force in the axial direction due to a temperature difference between the head 12 and the apical portion 13. Here, a thread portion 14 constituting an external thread is formed on at least the apical portion 13 of the thermoelectric element 10. In addition, in the present exemplary embodiment, the thread portion 14 is formed from a location near the head 12 to the apical portion 13.

The thermoelectric element 10 is formed seamlessly and integrally, for instance, by means of a lost-wax process. Specifically, the thermoelectric element 10 is formed of an alloy material capable of being used as a thermoelectric element in an as-cast state or a state of properly applying heat treatment to an as-cast casting product. As such material, materials that can be produced by melting are used suitably, for example, Fe—V—Al based material (for example, refer to JP 2007-227755A), Fe—Si type material (for example, refer to JP-H08-274380A, etc.), Mg—Si based material, Mn—Si based material, etc. are known.

As illustrated in FIG. 2, a thermoelectric module 20 relating one exemplary embodiment of the present disclosure is provided with a first connection electrode member 21, a second connection electrode member 22, a third connection electrode member 23 and nuts 24, in addition to a plurality of thermoelectric elements 10a, 10b, 10c, and 10d. Hereinafter, a structure of the thermoelectric module 20 is explained in detail, referring to FIG. 1 and FIG. 2.

A P type thermoelectric element 10a (it is corresponding to the "first thermoelectric element" of the present disclosure) and an N type thermoelectric element 10b (it is corresponding to the "second thermoelectric element" of the present disclosure) are electrically connected through the first connection electrode member 21 made of a copper plate. Specifically, the apical portion 13 of the thermoelectric element 10a and the apical portion 13 of the thermoelectric element 10b are screwed with fixing holes 25 or thread holes which are formed in advance in the first connection electrode member 21. Thereby, a connection, i.e., electrical connection between the thermoelectric elements 10a, 10b and the first connection electrode member 21 is realized.

Similarly, a P type thermoelectric element 10c (it is corresponding to the "third thermoelectric element" of the present disclosure) and an N type thermoelectric element 10d (it is corresponding to the "fourth thermoelectric element" of the present disclosure) are electrically connected through the second connection electrode member 22 made of a copper plate. Specifically, the apical portion 13 of the thermoelectric element 10c and the apical portion 13 of the thermoelectric element 10d are screwed with the fixing holes 25 or thread holes which are formed in advance in the second connection electrode member 22. Thereby, a connection, i.e., electrical connection between the thermoelectric elements 10c, 10d and the second connection electrode member 22 is realized.

The third connection electrode member 23 made of a copper plate is provided to bridge between the head 12 of the thermoelectric element 10b and the head 12 of the thermoelectric element 10c. The third connection electrode member 23 is fixed to the heads 12 of the thermoelectric element 10b and the thermoelectric element 10c with nuts 24 which are screwed with the thread portions 14 of the thermoelectric element 10b and the thermoelectric element 10c, respectively. Thereby, a connection, i.e., electrical connection between the thermoelectric elements 10b, 10c and the third connection electrode member 23 is realized.

Specifically, in the third connection electrode member 23, penetration holes 26 are provided, through which shanks 11 of the thermoelectric element 10b and the thermoelectric element 10c pass, without fitting (i.e., without secured thread engagement). The thread portions 14 are almost entirely formed on the shanks. Those penetration holes 26 is formed in the shape of an approximately cylinder (i.e., cylindrical hole). In addition, in the present exemplary embodiment, on upper sides in FIG. 2 of the penetration holes 26; that is, in positions corresponding to the heads 12 of the thermoelectric element 10b and the thermoelectric element 10c, the counterbored seating parts 27 are formed. The counterbored seating parts 27 i.e., formed in a shape complementary with the conical surface of the head, are concaves having reverse circular conical surfaces. The counterbored seating parts 27 are capable of contacting the surfaces of the heads 12. In the thermoelectric element 10b and the thermoelectric element 10c the shanks 11 (thread potions 14) pass through the penetration holes 26 without fitting. In such state, the nuts 24 are tightened to the third connection electrode member 23. Thereby, the third connection electrode member 23 is held by sandwiching between the heads 12 of the thermoelectric elements 10b, 10c and the nuts 24.

<Manufacturing Method>

Hereinafter, an outline of manufacturing method of the thermoelectric element(s) 10 and the thermoelectric module 20, having the above structure, is explained. First, the thermoelectric element(s) 10 is formed, e.g., by a lost-wax process using a lost-wax tree 30 illustrated in FIG. 3. The lost-wax process is a kind of the investment molding method which is a precision casting using an evaporative pattern. The solid molding method and the ceramic shell molding method can be used as the lost-wax process.

Figure 3:
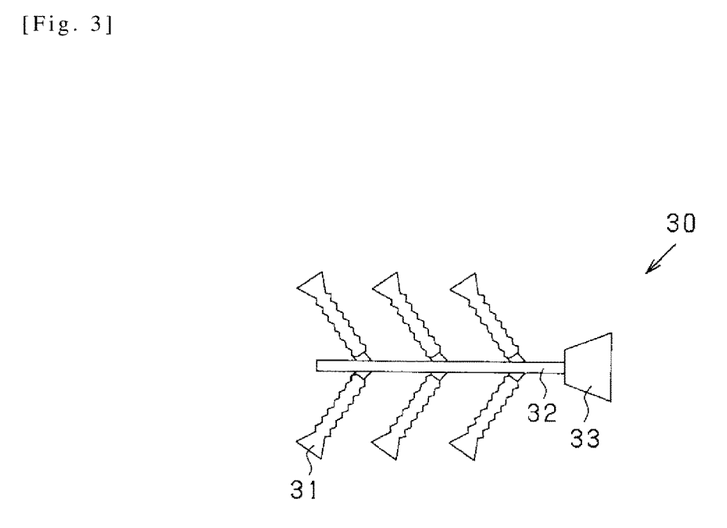
FIG. 3 is a plan view illustrating an appearance of a lost-wax tree used for a manufacturing method of the thermoelectric element illustrated in FIG. 1.

The lost-wax tree 30, which is the evaporative pattern made of wax, is capable of dewaxing (evaporating) from an inside of a precursor mold by heating of the precursor mold and melting of the wax. In addition, mold is formed by baking the dewaxed precursor mold. The lost-wax tree 30 is provided with element pattern parts 31, a runner forming (trunk) part 32, and a pouring gate forming part 33. The element pattern parts 31 are formed in a profile corresponding to the profiles of the thermoelectric elements 10. The element pattern parts 31 are branched from the runner forming (trunk) part 32 having a rod shape. The pouring gate forming part 33 having a reverse conical shape is connected to one end of the runner forming part 32.

A casting step by the lost-wax process is performed in the atmosphere, vacuum or inactive gas atmosphere, depending on the material(s) which constitutes the thermoelectric element(s) 10. A treatment (for example, polishing etc.) for removing an oxide film is performed onto contacting portions which are arranged on the thermoelectric element(s) 10 and contact the first, second and third connection electrode member 21, 22 and 23. Thereby, a contact resistance is reduced.

Thermoelectric elements 10a, 10b, 10c, and 10d formed by a lost-wax process are prepared as exemplified above. The shanks 11 of the thermoelectric elements 10b and 10c are firstly passed through the penetration holes 26 of the third connection electrode member 23. Next, the nuts 24 are attached to the thread portions 14 of the thermoelectric elements 10b and 10c, respectively. At this time, a predetermined distance is provided between the nuts 24 and the third connection electrode member 23.

Then, the apical portions 13 of the thermoelectric elements 10a and 10b are screwed into the fixing holes 25 of the first connection electrode member 21. Similarly, the apical portions 13 of the thermoelectric elements 10c and 10d are screwed into the fixing holes 25 of the second connection electrode member 22. Next, the nuts 24 are tightened by screwing toward the heads 12 until closely contacting with the third connection electrode member 23. Thereby, the thermoelectric module 20 equipped with so-called "PI type" structure is formed. In addition, brazing or diffusion connection, etc. is suitably applied on a threaded coupling portion between the apical portions 13 of the thermoelectric elements 10a to 10d and the first and second connection electrode members 21, 22 or a fixing portion using the nuts between the thermoelectric elements 10b, 10c and the third connection electrode member 23, if necessary.

<Effects>

As mentioned above, in the structure of the present exemplary embodiment, the thermoelectric element(s) 10 (10a-10d) has the thread portion 14. Therefore, the thermoelectric element(s) 10 is fastened to the electrode member(s) (first connection electrode member 21, etc.) using the thread portion(s) 14. Thus, a connection, i.e., electrically connection of the both element(s) and member(s) is realized. Moreover, a positioning of the thermoelectric element(s) 10 can be very easily performed using the fixing hole(s) 25 in advance provided in the predetermined position(s).

In detail, in the structure of the present exemplary embodiment, the thermoelectric element(s) 10 (10a-10d) has the screw thread profile. Therefore, the apical portions 13 of the thermoelectric elements 10 can be screwed with the first and second connection electrode members 21, 22 made of metal plates. Thus, a connection (electric connection) between the thermoelectric elements 10a, 10b and the first connection electrode member 21 are formed, and a connection (electric connection) between thermoelectric elements 10c, 10d and the second connection electrode member 22 are formed.

Moreover, the thread portions 14 of the thermoelectric elements 10b and 10c pass through the penetration holes 26 (provided in the third connection electrode member 23) without fitting (i.e., with certain play or clearance), then, in this state, the heads 12 of the thermoelectric element 10b and 10c are fixed to the third connection electrode member with the nuts 24 screwed with the thread portion 14 of the thermoelectric element 10b and the thermoelectric element 10c (by sandwiching of the third connection electrode member 23 between the heads 12 and the nuts). Thereby, the connection (electric connection) between the thermoelectric elements 10b and 10c and the third connection electrode member 23 is formed.

At this time, the positioning can be performed very easily, that is, the positioning between thermoelectric elements 10a-10d and first to third connection electrode members 21-23 and the positioning of adjacent thermoelectric elements 10 due to the fixing holes 25 and the penetration holes 26 provided in advance in predetermined positions in the first to third connection electrode members 21-23. Moreover, in case of performing the diffusion connection, etc., a fastening load at the time of screwing can be used as an initial pressure. Therefore, according to the present exemplary embodiment, the thermoelectric module 20 equipped with plurality of thermoelectric elements 10a-10d, having so-called "PI type" structure, can be realized by a simple manufacturing process.

Moreover, in the thermoelectric element 10 the thread portion 14 has an exposed part which is exposed outwards. i.e., not covered with the first to third connection electrode members 21-23 and nuts 24. The exposed part of the thread portion 14 functions as a radiating fin. Therefore, promotion is provided to generate the temperature difference between the head 12 and the apical portion 13 in the thermoelectric element 10. Thereby, an excellent thermoelectric conversion capability is acquired. Furthermore, in the present exemplary embodiment, the thermoelectric element 10 is formed by the lost-wax process which is a precision casting process using the evaporative pattern. Therefore, the thermoelectric element 10 having screw thread profile is provided with excellent mass productivity.

Thus, according to the exemplary embodiment, it is possible to save labor and time for positioning and connecting, when manufacturing the thermoelectric module 20 equipped with a plurality of thermoelectric elements 10 (10a-10d).

<Modifications and/or Variations>

Hereinafter, some are illustrated about typical modifications and/or variations. In the explanation of the following modifications and/or variations, the same reference sign as the above-mentioned exemplary embodiment shall be used for a portion(s) which has the same structure or composition and function as explained with the above-mentioned exemplary embodiment. And, as for an explanation(s) of such portion(s), the explanation in the above-mentioned exemplary embodiment shall be suitably referred to within a technically consistent extent. Needless to say, as for modifications and/or variations, they are also not limited to modifications and/or variations listed as follows. Moreover, any part of above-mentioned exemplary embodiment and all or any part of two or more modifications and/or variations may be suitably applied in combination within a technically consistent extent.

For example, the manufacturing method and the material of the thermoelectric element(s) 10 can be variously changed from the above-mentioned exemplary embodiments. Specifically, a synthetic resin, tin, frozen mercury, etc. can be used as the evaporative pattern. That is, the manufacturing method of the thermoelectric element(s) 10 is not limited to so-called "lost-wax process." Moreover, there is no limitation to the material of the thermoelectric element(s) 10, in particular, as far as precision casting using an evaporative pattern can be performed. That is, for example, there is an application possibility to the present disclosure for iron-base Heusler alloys (for example, $Fe_2VAl$, $Fe_2TiAl$, or Heusler alloys, and element-substituted Heusler alloys based on $Fe_2VAl$ and/or $Fe_2TiAl$ alloys, and also alloys containing those iron-base Heusler alloys.

Figure 4:
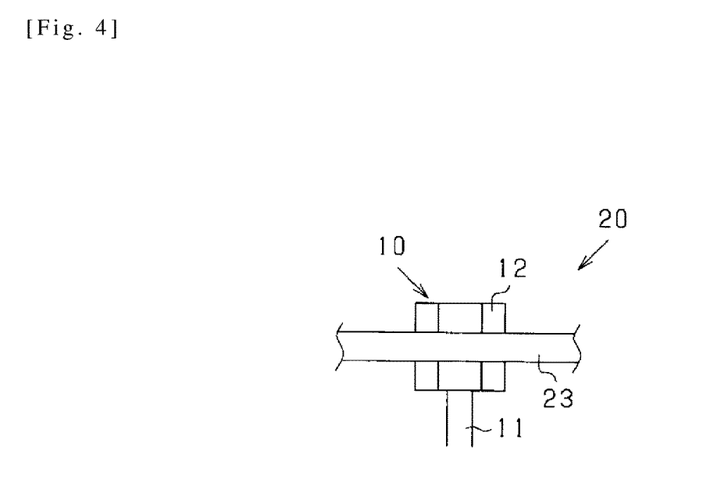
FIG. 4 is a side view illustrating a main structural portion of one modification of the thermoelectric module illustrated in FIG. 2.

The shape and structure of the thermoelectric element 10 and the thermoelectric module 20 are not limited to the above-mentioned exemplary embodiments at all. For example, formation of the thread portion 14 may be omitted on a part of the shank 11 (for example, a portion corresponding to the penetration hole 26 and a neighboring portion of the head 12). Moreover, various forms of the head 12 may also be chosen. For example, the head 12 may have a flange. Moreover, the thermoelectric element 10 may be formed in the shape of so-called a "hexagon head bolt" as illustrated in FIG. 4. In this case, the counterbored seating part 27 (refer to FIG. 2) may be not formed in the third connection electrode member 23.

The thermoelectric element 10 may be formed in the shape of so-called tapping screw. In this case, the screw part 14 (apical portion 13) of the thermoelectric element 10 is screwed with the fixing hole 25 which is formed as a prepared hole or cylindrical shape and has no thread (internal thread portion), thereby the thermoelectric element 10 can be fastened to the first connection electrode member 21 or the second connection electrode member 22.

A nut 24 may be also screwed with the thread portion 14 on the side of the first connection electrode member 21 or the second connection electrode member 22. In this case, the nut 24 functions as so-called "lock nut" by tightening such nuts 24 to the first connection electrode member 21 or the second connection electrode member 22. Thereby, fastening of the thermoelectric elements 10a and 10b to the first connection electrode member 21 and fastening of the thermoelectric elements 10c and 10d to the second connection electrode member 22 are performed satisfactorily.

Alternatively, the thermoelectric element 10 may be formed of a columnar member. The columnar member (10) has thread portions 14 on both ends. The thread portions 14 have smaller outer-diameters than a maximum outer diameter of the columnar member (10). When connecting of the columnar member (10), the columnar member (10) is abutted on the first to third connection electrode members 21-23 (or inside surfaces thereof), and a nut 24 is tightened to the thread portions 14 from outsides of the first to third connection electrode members 21-23. In this case, the columnar member may have a shape formed in an elliptical or polygonal shape, in a cross-sectional-view orthogonal to the axial direction.

The thermoelectric module 20 may also be structured so that the thermoelectric element 10 is screwed directly with the third connection electrode member 23. In this case, the nut 24 may be omitted, however, in case of presence of the nut 24, the nut 24 may function as so-called "lock nut" like the above-mentioned modification. Moreover, in this case, the thermoelectric element 10 may have only the screw part 14, without the head 12. Such thermoelectric element 10 is so-called "set screw" or "long thread screw".

The "thread portion" of the present disclosure is not limited to an external thread portion. That is, the above-mentioned thread portion may be changed into an internal thread portion. For example, a thread hole (internal thread portion) as a "thread portion" of the present disclosure may be formed on (in) one end in the axial direction of the above-mentioned pillar-shaped member. In this case, the fixing hole 25 may be formed as a penetration hole through which a bolt etc. passes.

A number of the thermoelectric elements 10 in the thermoelectric module 20 are not limited to four pieces as illustrated in FIG. 2. For example, the thermoelectric module 20 may be structured with a pair of thermoelectric elements 10a and 10b and the first connection electrode member 21 screwed with those elements 10a, 10b. In this case, thermoelectric elements 10a and 10b may be screwed with the first connection electrode member 21 on another (base) side (a side of the head 12) of the thread 14.

Alternatively, the thermoelectric module 20 may be provided with six or more thermoelectric elements 10. Particularly, in case of a large number of thermoelectric elements, according to the conventional structure, positioning and connecting while maintaining positions of the thermoelectric elements are more difficult in accordance with increase of the number. In contrast, the present disclosure is more advantageous in saving labor and time for positioning and connecting between thermoelectric elements and connection electrode(s), in accordance with increase of the number.

The entire disclosures of the above Patent Literature are incorporated herein by reference thereto. Modifications and adjustments of the exemplary embodiment(s) are possible within the scope of the overall disclosure (including the claims) of the present disclosure and based on the basic technical concept of the present disclosure. Various combinations and selections of various disclosed elements (including each element of each claim, each element of each exemplary embodiment, each element of each drawing, etc.) are possible within the scope of the present disclosure. That is, the present disclosure of course includes various variations and modifications that could be made by those skilled in the art according to the overall disclosure including the claims and the technical concept. Particularly, any numerical range disclosed herein should be interpreted that any intermediate values or subranges falling within the disclosed range(s) are also concretely disclosed even without explicit recital thereof.

REFERENCE SIGNS LIST

10 thermoelectric element
10a thermoelectric element (first thermoelectric element)
10b thermoelectric element (second thermoelectric element)
10c thermoelectric element (third thermoelectric element)
10d thermoelectric element (fourth thermoelectric element)
11 shank (axial part)
12 head (head portion)
13 apical portion (one end portion, one end side)
14 thread (thread portion)
20 thermoelectric (element) module
21 first connection electrode member
22 second connection electrode member
23 third connection electrode member
24 nut
25 fixing hole
26 penetration hole (through hole)
27 counterbored seating part
30 lost-wax tree

The invention claimed is:

1. A thermoelectric element, wherein
the thermoelectric element includes a shank at which is located a screw thread, the screw thread functioning as a radiating fin,
the screw thread is entirely formed on the shank,
an axial direction of the shank is defined as an electromotive force generating direction,
a head is formed at one end portion of the shank,
the thermoelectric element is formed of an alloy material,
the head is integral with the shank,
the shank is longer than the head in the axial direction, and
the head is larger than the shank in a radial direction.

2. The thermoelectric element according to claim 1, wherein the thermoelectric element is formed by precision casting using an evaporative pattern.

3. A thermoelectric module, comprising:
a first thermoelectric element(s) having one thermoelectric property of P or N type, the first thermoelectric element(s) being formed by precision casting using an evaporative pattern, the first thermoelectric element(s) including a shank at which is located a screw thread, and the screw thread functioning as a radiating fin, the screw thread being entirely formed on the shank, an axial direction of the shank being defined as an electromotive force generating direction;
a second thermoelectric element(s) having another thermoelectric property of P or N type, the second thermoelectric element(s) being formed by precision casting using an evaporative pattern, the second thermoelectric element(s) including a shank at which is located a screw thread, and the screw thread functioning as a radiating fin, the screw thread being entirely formed on the shank, an axial direction of the shank being defined as an electromotive force generating direction; and
a first connection electrode member(s) to which one end of each of the first and second thermoelectric elements are fastened together, using the screw thread, for electrically connecting therebetween, wherein
each screw thread of the first and second thermoelectric elements is also formed on portions exposed from the first connection electrode member(s) in each shank of the first and second thermoelectric elements.

4. The thermoelectric module according to claim 3, further comprising:
a third thermoelectric element(s) having the one thermoelectric property of P or N type, the third thermoelectric element(s) including a shank at which is located a screw thread, the screw thread functioning as a radiating fin;
a fourth thermoelectric element(s) having the another thermoelectric property of P or N type, the fourth thermoelectric element(s) including a shank at which is located a screw thread, and the screw thread functioning as a radiating fin;
a second connection electrode member(s) with which apical portions of the third and fourth thermoelectric elements are fastened, respectively, for electrically connecting therebetween; and
a third connection electrode member(s) bridging between base end portions of the second and third thermoelectric elements for electrically connecting therebetween.

5. The thermoelectric module according to claim 4, wherein
the third connection electrode member(s) is provided with penetration holes through which the screw thread of the second and third thermoelectric elements pass without fitting, and
the base end portions of the second and third thermoelectric elements are fastened to the third connection electrode member(s) with nuts which threadably engage the screw thread of the second and third thermoelectric elements, respectively.

6. A manufacturing method of a thermoelectric module, comprising:
fixing a head of a first thermoelectric element on a connection electrode member by tightening a nut on an end portion of the first thermoelectric element to sandwich the connection electrode member between the head of the first thermoelectric element and the nut, wherein the first thermoelectric element includes a shank at which is located a screw thread, the screw thread functions as a radiating fin, the screw thread is entirely formed on the shank, an axial direction of the shank is defined as an electromotive force generating direction, the first thermoelectric element is formed with the head on another end, the screw thread is screwed with the nut, and the screw thread of the first thermoelectric element is also formed on portions exposed from the connection electrode member and the nut on the shank of the first thermoelectric element when fixing the head of the first thermoelectric element on the connection electrode member by tightening the nut.

* * * * *